(12) United States Patent
Kaneko et al.

(10) Patent No.: US 9,222,001 B2
(45) Date of Patent: Dec. 29, 2015

(54) ADHESIVE SHEET, AS WELL AS OPTICAL MEMBER AND ORGANIC LIGHT EMISSION DEVICE USING THE SAME

(75) Inventors: Hiroki Kaneko, Hitachinaka (JP); Hiroshi Sasaki, Mito (JP); Akitoyo Konno, Hitachi (JP); Tomokazu Tanase, Hitachi (JP)

(73) Assignee: HITACHI, LTD., Tokyo (JP)

( * ) Notice: Subject to any disclaimer, the term of this patent is extended or adjusted under 35 U.S.C. 154(b) by 325 days.

(21) Appl. No.: 13/818,762

(22) PCT Filed: Aug. 16, 2011

(86) PCT No.: PCT/JP2011/068551
§ 371 (c)(1),
(2), (4) Date: Feb. 25, 2013

(87) PCT Pub. No.: WO2012/029536
PCT Pub. Date: Mar. 8, 2012

(65) Prior Publication Data
US 2013/0154473 A1      Jun. 20, 2013

(30) Foreign Application Priority Data

Sep. 1, 2010   (JP) ................................. 2010-195265

(51) Int. Cl.
*H01L 51/50* (2006.01)
*H01L 51/52* (2006.01)
*H01L 51/54* (2006.01)
(Continued)

(52) U.S. Cl.
CPC .... *C09J 7/02* (2013.01); *C09J 7/00* (2013.01); *H01L 51/5262* (2013.01); *H05B 33/14* (2013.01); *C09J 2203/318* (2013.01); *C09J 2433/00* (2013.01); *C09J 2483/00* (2013.01); *H01L 51/5246* (2013.01);
(Continued)

(58) Field of Classification Search
CPC ............ C09J 7/02; C09J 7/00; C09J 2433/00; C09J 2483/00; C09J 2203/318; H05B 33/14; Y10T 428/24405; H01L 51/5268; H01L 51/5262; H01L 51/5246; H01L 51/5275
USPC .................................................. 313/498–512
See application file for complete search history.

(56) References Cited

U.S. PATENT DOCUMENTS 6,080,802 A * 6/2000 Emmons et al. .............. 523/205
6,416,838 B1 7/2002 Arney et al.
(Continued)

FOREIGN PATENT DOCUMENTS

JP         07-508047 A        9/1995
JP         2002-088332 A      3/2002
(Continued)

*Primary Examiner* — Anne Hines
*Assistant Examiner* — Jose M Diaz
(74) *Attorney, Agent, or Firm* — Volpe and Koenig, P.C.

(57) ABSTRACT

An adhesive sheet 1 including a binder 3 and adhesive particles 2 mixed in the binder 3 in which the adhesive particle 2 includes an inorganic particle 21 and a polymer 22, the inorganic particle 21 is chemically bonded with the polymer 22, a portion of the adhesive particles 2 is exposed to the surface of the binder 3, the refractive index of the inorganic particle 21 is higher than the refractive index of the binder 3, and the adhesion of the adhesive particle 21 larger than the adhesion of the inorganic particle 21. An adhesive sheet having high refractive index and high adhesion, as well as an optical member and an organic member and an organic light emission device can be provided.

16 Claims, 7 Drawing Sheets

(51) Int. Cl.
*C09J 7/02* (2006.01)
*H05B 33/14* (2006.01)
*C09J 7/00* (2006.01)

(52) U.S. Cl.
CPC ........ *H01L 51/5268* (2013.01); *H01L 51/5275* (2013.01); *Y10T 428/24405* (2015.01)

(56) References Cited

U.S. PATENT DOCUMENTS

| | | | | |
|---|---|---|---|---|
| 7,851,995 | B2* | 12/2010 | Tyan et al. | 313/506 |
| 2004/0012980 | A1* | 1/2004 | Sugiura et al. | 362/560 |
| 2004/0157736 | A1* | 8/2004 | Ide | 503/210 |
| 2007/0229804 | A1* | 10/2007 | Inoue et al. | 356/213 |
| 2008/0138579 | A1* | 6/2008 | Hsu et al. | 428/148 |
| 2008/0303435 | A1* | 12/2008 | Cok | 313/506 |
| 2009/0052195 | A1 | 2/2009 | Saneto et al. | |
| 2009/0079908 | A1* | 3/2009 | Miyazaki et al. | 349/65 |
| 2009/0128917 | A1* | 5/2009 | Yoshinari et al. | 359/601 |
| 2009/0213464 | A1* | 8/2009 | Kurachi et al. | 359/599 |
| 2011/0227048 | A1* | 9/2011 | Newsome | 257/40 |
| 2012/0008206 | A1* | 1/2012 | Haga et al. | 359/488.01 |

FOREIGN PATENT DOCUMENTS

| | | |
|---|---|---|
| JP | 2003-513122 A | 4/2003 |
| JP | 2004-191450 A | 7/2004 |
| JP | 2005-075983 A | 3/2005 |
| JP | 2009-110930 A | 5/2009 |
| JP | 2009-120726 A | 6/2009 |

* cited by examiner

F I G . 9
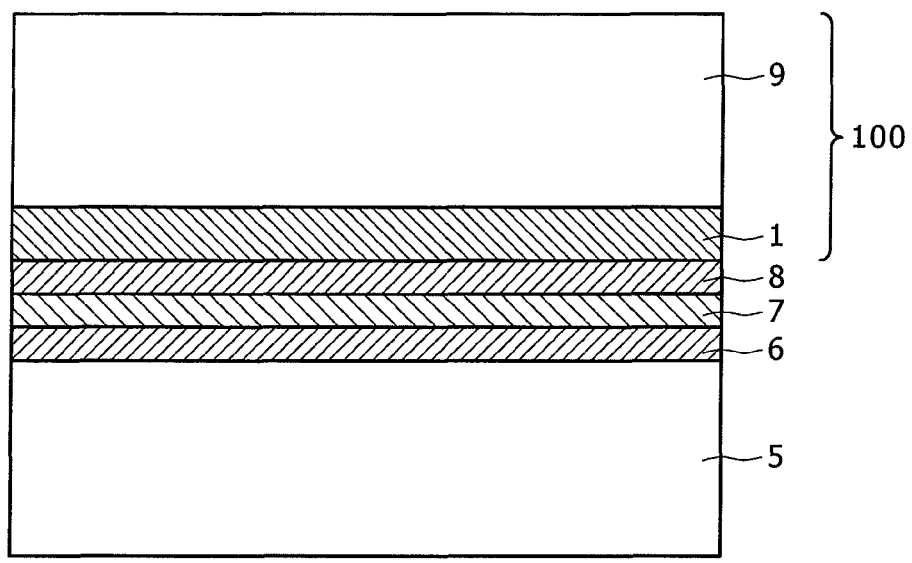

ADHESIVE SHEET, AS WELL AS OPTICAL MEMBER AND ORGANIC LIGHT EMISSION DEVICE USING THE SAME

TECHNICAL FIELD

The present invention concerns an adhesive sheet, as well as an optical member and an organic light emission device using the same.

BACKGROUND ART

As an existent example, Patent Literature 1 describes a transparent adhesive for use in optical members for controlling refractive index in which metal oxide particles having a refractive index of 2.0 or more and a dispersion average particle diameter of 1 nm or more and 20 nm or less are dispersed in a transparent adhesive for use in optical members with easy control for the refractive index, less total reflection or halation of light at an interface relative to a transparent optical substrate, capable of satisfying adhesive properties (adhesion strength, retainability, etc.) and durability such as heat resistance, light fastness, heat and moisture resistance and, in addition, with an aim of avoiding undesired effect on the light transmittance.

CITATION LIST

Patent Literature

Patent Literature 1: Japanese Unexamined Patent Application Publication No. 2009-120726

SUMMARY OF THE INVENTION

Technical Problem

In the existent technique, since particles of a metal oxide are exposed to the surface of an adhesive layer, there was a problem that the pressure sensitive adhesion of the adhesive layer is lowered.

The present invention intends to provide an adhesive sheet having high refractive index and high adhesion, as well as an optical member and an organic light emission device using the same.

Solution to Problem

In the present invention, adhesive particles mixed with a binder to form an adhesive sheet each comprise an inorganic particle and a polymer in which the inorganic particle and the polymer are chemically bonded, the adhesive particles partially are exposed to the surface of the binder, the refractive index of the inorganic particle is higher than the refractive index of the binder and the adhesion of the adhesive particle is larger than the adhesion of the inorganic particle.

Advantageous Effects of Invention

The present invention can provide an adhesive sheet having high refractive index and high adhesion, as well as an optical member and an organic light emission device using the same.

BRIEF DESCRIPTION OF DRAWINGS

FIG. 9 is a cross sectional view illustrating a configuration of an organic light emission device according to an embodiment of the invention.

DESCRIPTION OF EMBODIMENTS

Figure 1:
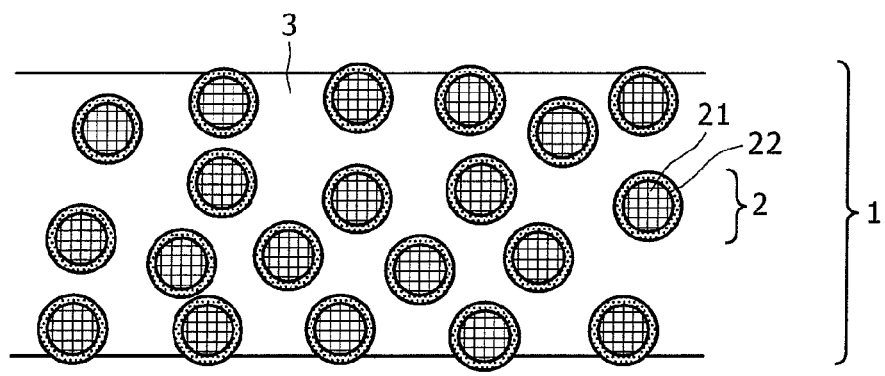
FIG. 1 is a cross sectional view illustrating a configuration of an adhesive sheet according to an embodiment of the invention.

Features of the adhesive sheet, the optical member, and the organic light emission device of the present invention are as described below.

The adhesive sheet includes a binder and adhesive particles mixed in the binder in which the adhesive particle includes an inorganic particle and a polymer, the inorganic particle is chemically bonded with the polymer, the adhesive particles are partially exposed to the surface of the binder, the refractive index of the inorganic particle is higher than the refractive index of the binder, and the adhesion of the adhesive particle is larger than the adhesion of the inorganic particle.

In the adhesive sheet, it is preferred that the polymer has substituents Y, the inorganic particle and the polymer are chemically bonded by way of a bonding site X, the bonding site X comprises one or more bonds selected from the group consisting of an amide bond, an ester bond, an ether bond, and an urethane bond, and the substituent Y is one or more members selected from the group consisting of an amino group, a sulfo group, a carboxyl group, and a hydroxyl group.

In the adhesive sheet, the number average molecular weight of the polymer is preferably from 200 to 50,000.

In the adhesive sheet, the inorganic particle is preferably one or more members selected from the group consisting of titanium oxide, zirconium oxide, barium titanate, and tin oxide.

In the adhesive sheet, the average particle diameter of the inorganic particles is preferably 5 to 100 nm.

In the adhesive sheet, the ratio of the adhesive particles is preferably 5 to 50 vol %.

In the adhesive sheet, the binder is preferably an acrylic or silicone type resin.

In the adhesive sheet, a dispersing solvent is preferably contained further.

In the adhesive sheet, the polymer is preferably a phenol resin or polyamic acid.

In the adhesive sheet, the polymer is one or more members selected from the group consisting of polyacrylic acid, polyvinyl alcohol, polyaspartic acid, polyglutamic acid, alginic acid, polyvinyl sulfonic acid, polystyrene sulfonic acid, and amylose.

The optical member includes a base member and an adhesive sheet, in which the adhesive sheet is bonded to the surface of the base member, and the base member comprises one or more members selected from the group consisting of resins, glass, ceramics, and metals.

An organic light emission device includes a lower substrate, an upper substrate, a lower electrode, an upper electrode, an organic layer, and the adhesive sheet, in which the lower electrode and the upper electrode are interposed between the lower substrate and the upper substrate, the organic layer is interposed between the lower electrode and the upper electrode, the adhesive sheet is interposed between the upper substrate and the upper electrode, the organic layer emits light by a voltage is application between the upper electrode and the lower electrode, and light generated from the organic layer radiates externally at least by way of the upper substrate.

Preferably, the organic light emission device further includes a light scattering layer and a transparent resin layer, in which the upper substrate is interposed between the light scattering layer and the transparent resin layer, the transparent resin layer is interposed between the upper substrate and the upper electrode, the adhesive sheet is interposed between the transparent resin layer and the upper electrode, the transparent resin layer has concavo/convex shape, and the refractive index of the adhesive sheet is higher than the refractive index of the transparent resin layer.

Preferably, the organic light emission device further includes a light scattering layer and a transparent resin layer in which the upper substrate is interposed between the upper electrode and the transparent resin layer, the transparent resin layer is interposed between the light scattering layer and the upper substrate, the adhesive sheet is interposed between the upper substrate and the transparent resin layer, the transparent resin layer has an concavo/convex shape, a gap is disposed between the lower substrate and the lower electrode, and the refractive index of the adhesive sheet is higher than the refractive index of the transparent resin layer.

A method of manufacturing the adhesive sheet includes an inorganic particle dispersion step of preparing a liquid dispersion by adding inorganic particles to a dispersing solvent, a reaction step of adding a silane coupling agent to the liquid dispersion thereby bonding the silane coupling agent and the inorganic particle, an adhesive particle preparation step of adding a polymer to a liquid obtained by the reaction step and chemically bonding the inorganic particle and the polymer thereby manufacturing adhesive particles, and a step of mixing the adhesive particles and the binder, in which the refractive index of the inorganic particle is higher than the refractive index of the binder, and the adhesion of the adhesive particle is larger than the adhesion of the inorganic particle.

Preferred embodiments of the invention are to be described with reference to the drawings, etc. The following description show specific embodiments for the content of the present invention and the invention is not restricted to such descriptions and can be changed or modified variously by those skilled in the art within a range of the technical idea disclosed in the present specification. Throughout the drawings for explaining the embodiments, those having an identical function carry the same reference sign for which duplicate description is to be omitted.

[Adhesive Sheet]

FIG. 1 is a cross sectional view illustrating a configuration of an adhesive sheet of an embodiment according to the invention.

As shown in the drawing, in the adhesive sheet 1 of the invention, adhesive particles 2 are mixed in a binder 3 and formed into a thin sheet-like shape. The adhesive particle 2 comprises an inorganic particle 21 and a polymer 22. The adhesive particle 2 may consist only of the inorganic particle 21 and the polymer 22, or the adhesive particle 2 may contain other materials than the inorganic particle 21 and the polymer 22.

Figure 2A:
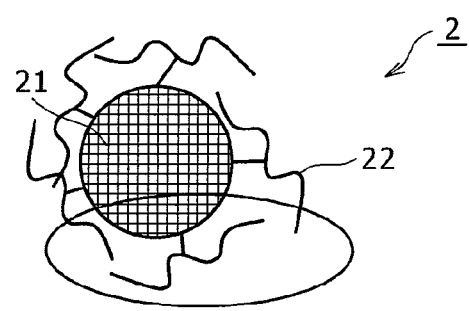
FIG. 2A is a schematic view illustrating the configuration of an adhesive particle according to the embodiment of the invention.

FIG. 2A is a schematic view illustrating a configuration of adhesive particles according to the embodiment of the present invention. Further, FIG. 2B is a schematic view illustrating a configuration at the surface of the adhesive particles in FIG. 2A.

In FIG. 2A, an adhesive particle 2 has a configuration in which a plurality of polymers 22 are attached to the surface of an inorganic particle 21.

Figure 2B:
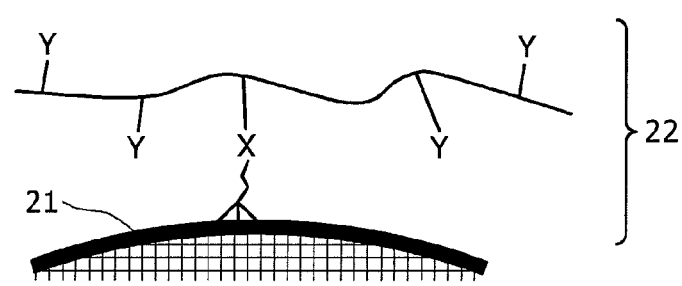
FIG. 2B is a schematic view illustrating a configuration of the surface of the adhesive particle in FIG. 2A.

As shown in FIG. 2B, the polymer 22 has a bonding site X and substituents Y in which the inorganic particle 21 is chemically bonded with the plurality of polymers 22 each by way of the bonding site X on the side chain of the polymer 22.

In the embodiment of the invention, since the inorganic particles 21 of a high refractive index are dispersed as the adhesive particles 2 in the binder, the refractive index assuming the entire adhesive sheet as a uniform medium is higher than that in the case of binder alone. That is, the refractive index of the adhesive sheet 1 is higher than the refractive index of the binder 3.

Figure 3:
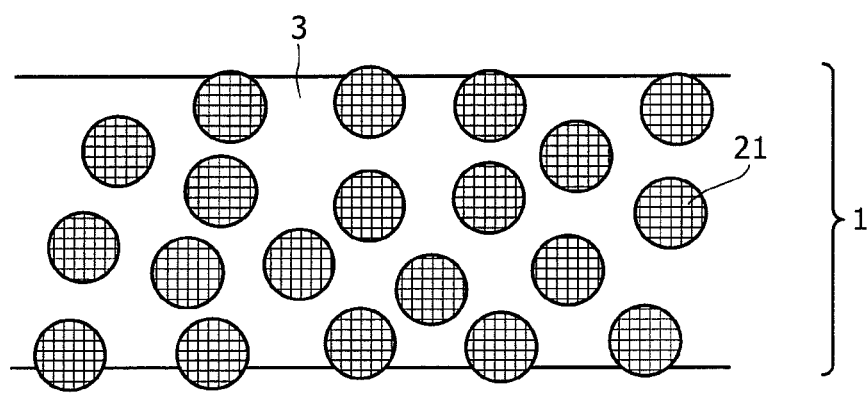
FIG. 3 is a cross sectional view illustrating a configuration of an existent adhesive sheet.

Increase in the refractive index of the entire adhesive sheet can be attained also by the configuration of an existent adhesive sheet in which the inorganic particles 21 are mixed in the binder as shown in FIG. 3. However, since the inorganic particles 21 are exposed to the surface of the adhesive sheet 1 (binder 3), the inorganic particle 21 exposed to the surface hinder the adhesion. Particularly, when the amount of mixing the inorganic particles 21 to be mixed is increased for obtaining a high refractive index, adhesion lowers remarkably.

On the contrary, in the embodiment of the invention, the inorganic particle 21 is covered by the polymer 22 by way of the side chain having a bonding site X. The polymer 22 may entirely cover the inorganic particle 21 or may partially cover the inorganic particle 21. Accordingly, even when the adhesive particles 2 are exposed to the surface of the adhesive sheet 1, since the exposed portion also contributes to adhesion, the adhesion strength of the adhesive sheet according to the embodiment of the invention can be improved compared with the existent case when inorganic particles are mixed by the same amount as in the existent case. This is because the adhesion of the adhesive particle 2 or the adhesion of the polymer contained in the adhesive particle 2 is larger than the adhesion of the inorganic particle 21. Further, since the adhesion less lowers compared with that of the existent case, an adhesive sheet 1 of higher refractive index can be formed by increasing the ratio (concentration) of the adhesive particles 2 to the binder 3.

The refractive index of the adhesive sheet 1 and the binder 3 can be measured by a prism coupler method. For measurement of the refractive index, a light source at a wavelength of 651 nm is used. "Adhesion (adhesion strength)" is determined by bonding two sheets of glass substrates by way of an object to be measured for adhesion, pulling the glass substrates perpendicular to the bonded surface, and measuring the force per unit area upon detachment of glass.

The refractive index of the adhesive sheet 1 can be controlled to 1.6 or more and 2.0 or less by the refractive index and the addition amount of the inorganic particles 21 to be mixed, the refractive index of the binder 3, etc. Further, the adhesive sheet 1 is highly transparent. The thickness of the adhesive sheet 1 is preferably 10 μm or more and 200 μm or less. If the thickness of the adhesive sheet 1 is less than 10 μm, tolerance of the film thickness is difficult to be controlled and, if the thickness of the adhesive sheet 1 is more than 200 μm, the adhesive sheet 1 per se tends to be fractured when the adhesive sheet 1 is pulled.

In the present specification, the expression for the range of numerical values, for example, "1.6 or more 2.0 or less" is identical with "1.6 or more and 2.0 or less" which has the same meaning as "1.6 to 2.0". This is also applicable to other expression for the range of numerical values including "or more" and "or less".

[Binder]

As the binder 3 in the embodiment of the invention, resins such as acrylic or silicone type resins having adhesion can be utilized. Specifically, they include, for example, resins formed by homopolymerization of monomers such as ethylhexyl acrylate, butyl acrylate, 2-methoxyethyl acrylate, vinyl acetate, acrylonitrile, styrene, methyl methacrylate, ethyl acrylate, and methyl acrylate alone or copolymerization of several kinds of them, addition reaction type silicone, peroxide silicone, epoxy, etc. They may be used alone or two or more of them may be used in admixture or by copolymerization. When the content of the adhesive particles 2 in the binder 3 is small, the adhesion strength of the binder 3 contributes at a high proportion to the adhesion strength of the adhesive sheet 1. In this case, it is preferred that the binder 3 has adhesion.

Further, when the content of the adhesive particles 2 to the binder 3 is large, that is, the volumic ratio of the adhesive particles 2 (ratio) is 30 vol % (30% by volume) or more, the adhesive particles exposed to the surface contribute at a high proportion to the adhesion strength of the adhesive sheet 1. Accordingly, when the volumic content of the adhesive particles 2 is high, various resins such as a non-adhesive rubber type, hydrocarbon type, silicon type or the like can be used for the binder 3. Specifically, the resins include, for example, isoprene, styrene butadiene, polyisobutyrene, styrene butadiene styrene, styrene isoprene styrene, styrene ethylene butylenes styrene, styrene ethylene propylene styrene, polybutadiene, and addition reaction type silicone, oxide silicone, polypropylene, and polyethylene. They may be used alone or two or more of them may be used in admixture or by copolymerization. The volumic ratio of the adhesion particles 2 is preferably 5 vol % or more and 50 vol % or less. The volumic ratio of the adhesive particles 2 means the volumic ratio of the adhesive particles 2 to the total amount of the adhesive particles 2 and the binder 3.

[Inorganic Particles]

The inorganic particle 21 in the embodiment of the invention may be formed of any material so long as the material shows less absorption at a wavelength of light to be used and has higher refractive index than that of the binder 3. Particularly, when the wavelength of light to be used is that of visible light (380 nm or more and 780 nm or less), a metal oxide such as titanium oxide, zirconium oxide, tin oxide, or barium titanate having high refractive index (refractive index of 1.6 or more and 2.6 or less) and high transparency in a visible light region is preferred as the inorganic particle 21. Further, scattering in the adhesive sheet 1 can be suppressed by decreasing the size of the inorganic particle 21 to less than the wavelength of light. Assuming the use of visible light, when the inorganic particles 21 having an average particle diameter of 500 nm or less and, more preferably, 100 nm or less are used, scattering caused by the difference of refractive index between the inorganic particle 21 and the binder 3 can be decreased. On the other hand, if the particle diameter is excessively fine, since the crystal structure of the metal oxide becomes amorphous, the refractive index of the metal oxide is lower than the refractive index of a bulk to deteriorate the effect of increasing the refractive index. Accordingly, the average particle diameter of the inorganic particles 21 is preferably 5 nm or more. The average particle diameter used herein is determined by a dynamic scattering method.

[Polymer]

The polymer 22 in the embodiment of the invention has a bonding site X and substituents Y and is chemically bonded with the inorganic particle 21 by way of the bonding site X in the side chain of the polymer 22. The adhesive particle 2 in the embodiment of the invention is manufactured, for example, as below.

At first, a silane coupling agent having a substituent X' as a portion of the bonding site X and an inorganic particle 21 are bonded to attach the silane coupling agent to the surface of the inorganic particle 21. In this case, the silane coupling agent is attached to the surface of the inorganic particle 21 such that the substituent X' does not directly react with the inorganic particle 21 but is present on the side of the outer surface of the silane coupling agent (on the side not in contact with the inorganic particle 21) that covers the inorganic particle 21.

Then, the polymer 22 having the substituent Y and the substituent X' are chemically bonded to form a bonding site X. When the number of the substituents Y is more than the number of the substituents X', the substituents Y remain also after the formation of the bonding sites X. The silane coupling agent and the inorganic particle 21 may be bonded by dispersing the inorganic particles 21 in a dispersing solvent such as ethylene glycol. The dispersing solvent includes, for example, glycerine and water. The dispersing solvent dissolves the silane coupling agent tending to fit the silane coupling agent to the surface of the inorganic particle 21. When the inorganic particles 21 are dispersed in the dispersing solvent such as ethylene glycol, a trace amount of the dispersing solvent may sometimes remain to the adhesive sheet 1.

As the silane coupling agent, N-2-(aminoethyl)-3-aminopropyl methyl dimethoxy silane, N-2-(aminoethyl)-3-aminopropyl trimethoxy silane, N-2-(aminoethyl)-3-aminopropyl triethoxy silane, 3-aminopropyl trimethoxy silane, 3-aminopropyl triethoxy silane, 3-isocyanate propyl triethoxy silane, etc. may be considered.

For example, in a case where the substituent X' is one of amino group, isocyanate group, hydroxyl group, and carboxyl group and the substituent Y is hydroxyl group or carboxyl group, the bonding site X is one of an amide bond (NHCO), an ester bond (OCO), an ether bond (O) and a urethane bond (NHCOO). The polymer 22 may have two or more bonding sites X.

The substituent Y capable of bonding with the substituent X' to form the bonding site X and developing adhesion is preferred and hydrophilic hydroxyl group, carboxyl group, amino group, or sulfo group is suitable. "Developing adhesion" referred to herein means such a property that when two sheets of glass substrates bonded to each other by way of a polymer 22 are pulled in perpendicular to the bonded surface of the glass substrates, a force per unit area of upon detachment of the glass is 0.005 g weight $N/mm^2$ or more. One or more substituents Y may be present in the polymer 22.

The number average molecular weight of the polymer 22 is preferably 200 or more and 50,000 or less and 2,000 or more and 30,000 or less. If the number average molecular weight of the polymer 22 is excessively small, since the surface of the inorganic particle 21 cannot be covered sufficiently by the polymer 22, dispersibility into the binder 3 is lowered. On the other hand, if the number average molecular weight of the polymer 22 is excessively large, since the volume of the polymer 22 is increased compared with that of the inorganic particle 21, the refractive index as a bonded product of the inorganic particle 21 and the polymer 22 (adhesive particle) is lowered. The number average molecular weight is measured by gel permeation chromatography. The polymer includes, for example, polyacrylic acid, polyvinyl alcohol, polyaspartic acid, polyglutamic acid, alginic acid, polyvinyl sulfonic acid, polystyrene sulfonic acid, and amylase. One or more of polymers 22 may be used as the polymer 22.

Further, as described above, since the polymer 22 is bonded to the inorganic particle 21, a polymer 22 of a determined molecular weight can be attached to the inorganic particle 21 compared with the process of transforming the monomer into the polymer by polymerizing reaction, and the manufacturing process is stabilized.

The content of the present invention is to be described more specifically below with reference to specific examples.

Example 1

Barium titanate having an average particle diameter of 20 nm was dispersed in ethylene glycol. Then, N-2-(aminoethyl)-3-aminopropyl triethoxy silane was added and stirred while being kept at 60° C., and N-2-(aminoethyl)-3-aminopropyl triethoxy silane was bonded to barium titanate. Then, ethylene glycol in which a polyacrylic acid having a number average molecular weight of 5,000 was dissolved was added to obtain adhesive particles dispersed in ethylene glycol while being kept at 60° C. The adhesive particle had an amide bond formed by reaction of the amino group of N-2-(aminoethyl)-3-aminopropyl triethoxy silane and the carboxyl group of the polyacrylic acid. Further, the surface of the barium titanate is covered with an adhesive polyacrylic acid. Then, the solvent was substituted from ethylene glycol to N-methyl-2-pyrrolidone by centrifugation. Further, the adhesive particles were mixed with an adhesive acrylic resin (2-ethylhexyl polyacrylate). The mixture was coated on a glass substrate by a bar coater to form an adhesive sheet of 2 μm thickness on the glass substrate.

The refractive index of the obtained adhesive sheet was 1.68, which was improved by about 0.2 from the refractive index of 1.48 of the basic acrylic resin. The volumic ratio of the adhesive particle 2 was 45 vol %. The adhesive sheet was transparent in appearance and had adhesion comparable with that of the adhesive sheet formed only of a modified acryl product.

Example 2

Barium titanate having an average particle diameter of 20 nm was dispersed in N-methyl-2-pyrrolidone. Then, 3-glycidoxy propyl trimethoxy silane was added and stirred while being kept at 60° C. and bonded to barium titanate. Then, N-methyl-2-pyrrolidone containing a polyvinyl alcohol having a number average molecular weight of 5,000 dissolved therein was added to obtain adhesive particles dispersed in N-methyl-2-pyrrolidone. The adhesive particle had an ether bond formed by reaction of the glycidyl group of 3-glycidoxy propyl trimethoxy silane and the hydroxyl group of polyvinyl alcohol. Further, the surface of barium titanate was coated with an adhesive polyvinyl alcohol. Then, the solvent was replaced with N-methyl-2-pyrrolidone by centrifugation. Further, the adhesive particles were mixed with an adhesive acrylic resin. The mixture was coated over a glass substrate by a bar coater to form an adhesive sheet of 2 μm thickness on a glass substrate.

The refractive index of the obtained adhesive sheet was 1.68, which was improved by about 0.2 from the refractive index of 1.48 of the basic acrylic resin. The volumic ratio of the adhesive particle 2 was 45 vol %. The adhesive sheet was transparent in appearance. While the adhesion of the adhesive sheet was lowered compared with that of the adhesive sheet formed only of the modified acrylic product, it still kept a sufficient adhesion.

Example 3

Ziriconium oxide having an average particle diameter of 20 nm was dispersed in ethylene glycol. Then, N-2-(aminoethyl)-3-aminopropyl triethoxy silane was added and stirred while being kept at 60° C., and N-2-(aminoethyl)-2-aminopropyl triethoxy silane was bonded with ziriconium oxide. Then, ethylene glycol containing a polyacrylic acid having a number average molecular weight of 5,000 dissolved therein was added to obtain adhesive particles, dispersed in ethylene glycol while being kept at 60° C. The adhesive particle has an amide bond formed by reaction of the amino group of N-2-(aminoethyl)-3-aminopropyl triethoxy silane and the carboxyl group of the polyacryl acid. Further, the surface of barium titanate was coated with the polyacrylic acid. Then, the solvent was replaced with N-ethyl-2-pyrrolidone by centrifugation. Further, the adhesive particles were mixed with an adhesive acrylic resin. The mixture was coated by a bar coater on a glass substrate and an adhesive sheet of 2 μm thickness was formed on the glass substrate.

The refractive index of the obtained adhesive sheet was 1.63, which was improved by about 0.15 from the refractive index of 1.48 of the basic acrylic resin. The volumic ratio of the adhesive particle 2 was 45 vol %. The adhesive sheet was transparent in appearance and had adhesion comparable with that of the adhesive sheet formed only of the modified acrylic product.

Example 4

Barium titanate having an average particle diameter of 20 nm was dispersed in ethylene glycol. Then, 3-isocyanate propyl trimethoxy silane was added and stirred while being kept at 60° C., and bonded with barium titanate. Then, ethylene glycol containing a polyvinyl alcohol having a number average molecular weight of 5,000 being dissolved therein was added and dispersed while being kept at 60° C. to obtain adhesive particles dispersed in ethylene glycol. The adhesive particle had a urethane bond formed by reaction of the isocyanate group of 3-isocyanate propyl triethoxy silane and the hydroxyl group of the polyvinyl alcohol. Further, the surface of the barium titanate is coated with an adhesive polyvinyl alcohol. Subsequently, the solvent was replaced with N-methyl-2-pyrrolidone by centrifugation. Further, the adhesive particle was mixed with an adhesive acrylic resin. The mixture was coated on the substrate with a bar coater to form adhesive sheet of 2 μm thickness.

The refractive index of the obtained adhesive sheet was 1.68, which was improved by about 0.2 from the refractive index of 1.48 of the basis acrylic resin. The volumic ratio of the adhesive particle 2 was 45 vol %. The adhesive sheet was transparent in appearance. While the adhesion of the adhesive sheet was lowered compared with the adhesive sheet formed only of the modified acrylic product, it still kept a sufficient adhesion.

Comparative Example 1

Barium titanate having an average particle diameter of 20 nm was dispersed in ethanol. Then, N-2-(aminoethyl)-3-aminopropyl triethoxy silane was added and stirred while being kept at 60° C., and N-2-(aminoethyl)-3-aminopropyl triethoxy silane was bonded with barium titanate.

Subsequently, the solvent was replaced with N-methyl-2-pyrrolidone by centrifugation. Further, the adhesive particle was mixed with a modified adhesive acrylic product. This was coated on a glass substrate by a bar coater to form an adhesive layer on the glass substrate. The refractive index of the obtained adhesive sheet was 1.65 and the sheet was transparent. The adhesion was remarkably poor when compared with the adhesive sheet consisting only of the modified acrylic product.

Example 5

An adhesive sheet using a phenolic resin, a polyamic acid, etc. as the polymer was applied to an organic light emission device. In this case, since the content of water in the adhesive sheet is extremely small, degradation of the organic light emission device can be suppressed.

Example 6

Figure 4:
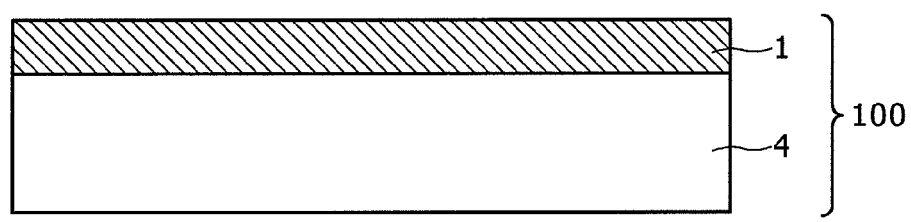
FIG. 4 is a cross sectional view illustrating a configuration of an optical member according to an embodiment of the invention.

FIG. 4 is a view illustrating an optical member 100 according to an embodiment of the invention.

The optical member 100 comprises a base member 4 and an adhesive sheet 1. The adhesive sheet 1 according to the embodiment of the invention is stacked over the base member 4. The base member 4 includes resins, glass, ceramics, metals or stacked body thereof (comprising one or more of them).

Figure 5:
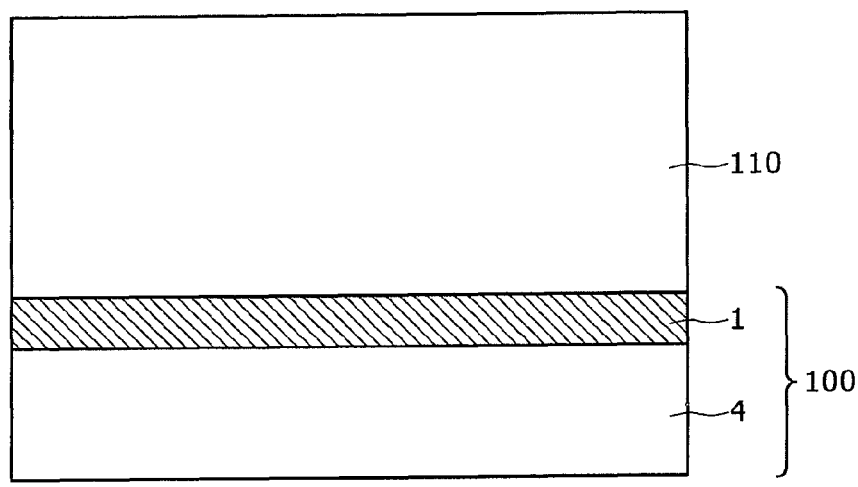
FIG. 5 is a cross sectional view illustrating an example of an optical member according to an embodiment of the invention.

FIG. 5 is a view of using the optical member 100 according to the embodiment of the invention to a glass substrate or the like.

As illustrated in FIG. 5, an adhesive sheet 1 is bonded to the surface of a substrate 110 made of glass. A base member 4 is bonded to the surface of the adhesive sheet 1 not bonded with the substrate 110. The refractive index of the substrate 110 is 1.5. Interfacial reflection occurs at the interface between the adhesive sheet 1 and the base member 4 and at the interface between the adhesive sheet 1 and the substrate 110. Accordingly, in a case where the base member 4 is a transparent film, when the optical member 100 according to the embodiment of the invention is bonded to window glass, more external light can be reflected than on usual, glass and the sunlight less intrudes into a room.

Instead of the substrate 110, other members comprising transparent materials may also be used. The transparent film is preferably a material excellent in the properties of transparency, weather proofness, gas barrier property, chemical resistance, impact resistance, low cost, etc. depending on the purpose. Specifically, the material includes, for example, PE (polyethylene), PET (polyethylene terephthalate), PVC (polyvinyl chloride), PVDC (polyvinylidene chloride), PLA (polylactic acid), PP (polypropylene), PA (pulyamide), PC (polycarbonate), PTFE (tetrafluoro ethylene), PU (polyurethane), PS (polystyrene), ABS (acrylonitrile-butadiene-styrene copolymer), PMMA (polymethyl methacrylate), POM (polyacetal), polyester, pulydimethyl siloxane (PDMS), polyether sulfone, COP (cycloolefin), etc. and glass.

Example 7

Figure 6:
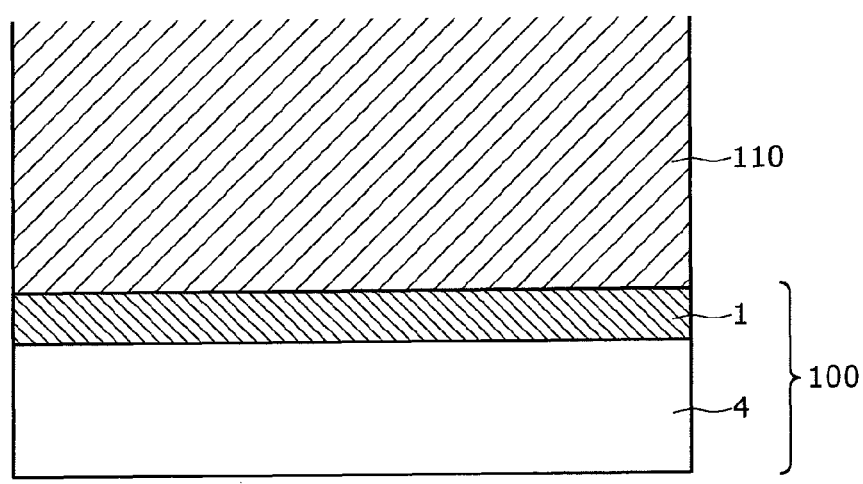
FIG. 6 is a cross sectional view illustrating an example of an optical member according to the embodiment of the invention.

FIG. 6 is a cross sectional view using the optical member 100 according to the embodiment of the invention to a metal substrate, etc.

As illustrated in FIG. 6, the substrate 110 in Example 6 is replaced with a metal substrate. In this case, surface reflection at the substrate 110 increases to provide a mirror of high reflectance.

Figure 7:
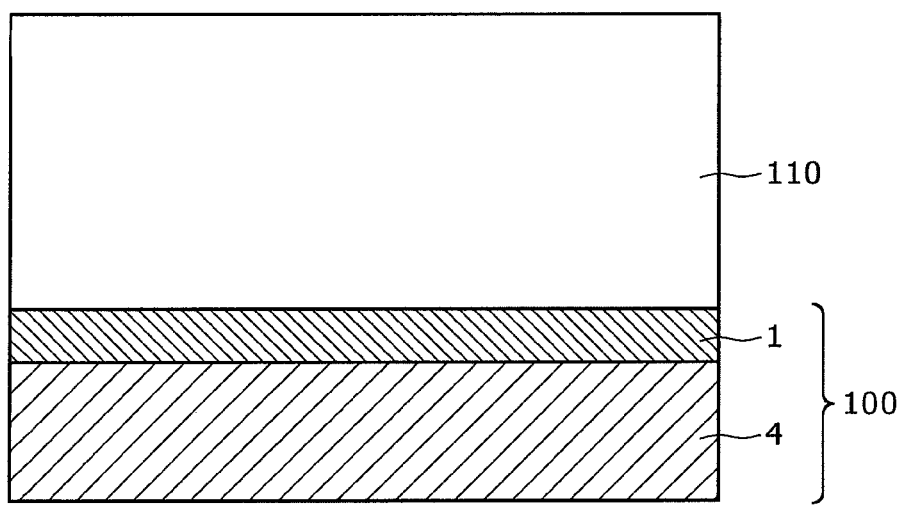
FIG. 7 is a cross sectional view illustrating an example of the optical member according to an embodiment of the invention.

FIG. 7 is a cross sectional view illustrating the optical member 100 according to the embodiment of the invention using a metal substrate or the like.

As illustrated in FIG. 7, a base member 4 of the optical member 100 is formed of a metal, which is bonded to a transparent substrate 110 such as glass. Also in this case, surface reflection at the substrate 4 increases to provide a mirror of high reflectance.

Example 8

Figure 8:
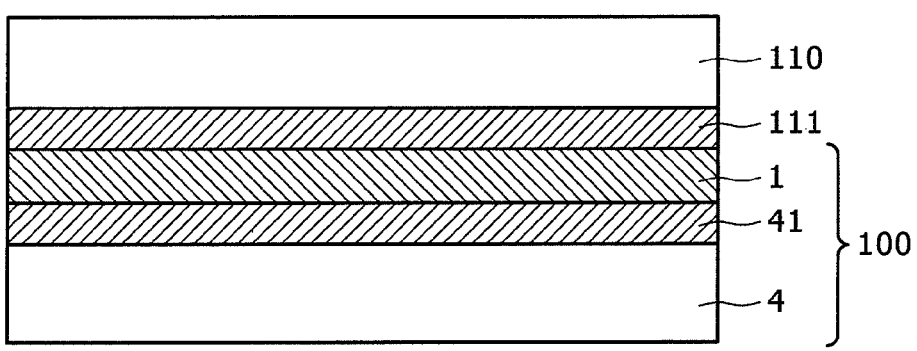
FIG. 8 is a cross sectional view illustrating an example of an optical member according to an embodiment of the invention.

FIG. 8 is a cross sectional view illustrating an optical member 100 according to the embodiment of the invention, which is applied to a capacitor or the like.

The surface of a base member 4 is covered with an electrode 41, which is bonded by way of an adhesive sheet 1 to a substrate 110 having an electrode 111 provided separately. This is because the metal oxide such as barium titanate added to the adhesive sheet 1 for improving the reflectance is a material highly dielectric constant. Particularly, in a case when the base member 4 and the substrate 110 comprise a transparent material such as glass, and the electrode 41 and the electrode 111 covering the respective surfaces are transparent electrodes such as formed of ITO, a light transmitting transparent capacitor can be formed. In the same manner, a capacitor having a mirror, function can be formed by forming one of the electrode, the substrate, and the base member with a metal. When a transparent capacitor is formed by using the optical member 100 according to the embodiment of the invention, since fine particles can be dispersed at a higher density than that in the existent technique, a capacitor of further larger electrostatic capacitance can be attained.

Example 9

FIG. 9 is a cross sectional view using an adhesive sheet of embodiment of the invention to an organic light emission device. FIG. 9 illustrates a so-called top emission type organic light emission device.

As illustrated in FIG. 9, the organic light emission device according to the embodiment of the invention includes a lower substrate 5, a lower electrode 6, an organic layer 7, an upper electrode 8, an adhesive sheet 1, and an upper substrate 9. An illumination apparatus is obtained by providing the organic light emission device with a driving device, etc. for driving the organic light emission device.

The lower electrode 6 and the upper electrode 8 are interposed between the lower substrate 5 and the upper substrate 9. The lower substrate 5, the lower electrode 6, the upper electrode 8, and the upper substrate 9 are disposed in the direction of taking out light. The organic layer 7 is interposed between the lower electrode 6 and the upper electrode 8. An adhesive sheet 1 is interposed between the upper substrate 9 and the upper electrode 8. When a voltage is applied to flow an electric current between the upper electrode 8 and the lower electrode 6, the organic layer 7 emits light. The light generated from the organic layer 7 exits through the upper electrode 8, the adhesive sheet 1, and the upper substrate 9. That is, light generated from the organic layer 7 is taken out to the organic layer on the side where the upper substrate 9 is present. In a case where the lower electrode 6 is transparent, light exits externally also on the side of the lower substrate 5. The lower substrate 5 and the lower electrode 6, the lower electrode 6 and the organic layer 7, and the organic layer 7 and the upper electrode 8 may be in contact with each other and other layer may be interposed between each of the layers.

The lower substrate 5 and the upper substrate 9 include glass substrates and plastic substrates formed of inorganic materials such as $SiO_2$, $SiN_x$, $Al_2O_3$, etc. The material for the plastic substrate includes, for example, polychloroprene, polyethylene terephthalate, polyoxymethylene, polyvinyl chloride, polyvinylidene fluoride, cyanoethyl pullluran, polymethyl methacrylate, polysulfone, polycarbonate, and polyimide, but the materials are not restricted to them. The refractive index of each of the lower substrates and the upper substrate 9 is about 1.5 and, specifically, 1.50 or more and 1.56 or less.

The lower electrode 6 and the upper electrode 8 are used as reflection electrodes or used as transparent electrodes. The reflection electrode comprises, for example, metals such as indium, molybdenum, and nickel, alloys thereof, and inorganic materials such as polysilicon and amorphous silicon. Further, the material includes stacked films in which a transparent conductive film such as of tin oxide, indium oxide, indium tin oxide (ITO), indium, zinc oxide (IZO), etc. is formed over the metal or the alloy described above but they are not restrictive. The material for the transparent electrode includes IZO and ITO, but they are not restrictive.

The lower electrode 6, the organic layer 7, and the upper electrode 8 are formed over the lower substrate 5 by vapor deposition, printing, etc. On the other hand, an optical member 100 having the adhesive sheet 1 formed to the lower surface of the upper substrate 9 is formed. The upper electrode 8, and the upper substrate 9 are bonded to each other by the adhesive sheet 1. By bonding the optical member 100 to the upper electrode 8, an organic light emission device can be manufactured easily.

The refractive indexes of the lower electrode 6, the organic layer 7, and the upper electrode 8 are as high as 1.8 or more and 2.2 or less and, if the refractive index of the adhesive sheet 1 is low, total reflection occurs at the interface between the lower electrode 6 and the organic layer 7 and the interface between the organic layer 7 and the upper electrode 8 to decrease the ratio of light that can be taken out to the upper substrate 9. However, since the adhesive sheet 1 of the embodiment of the invention is high, the total reflection generated at the interface mentioned above can be decreased to enhance the light take-out efficiency.

Example 10

Figure 10:
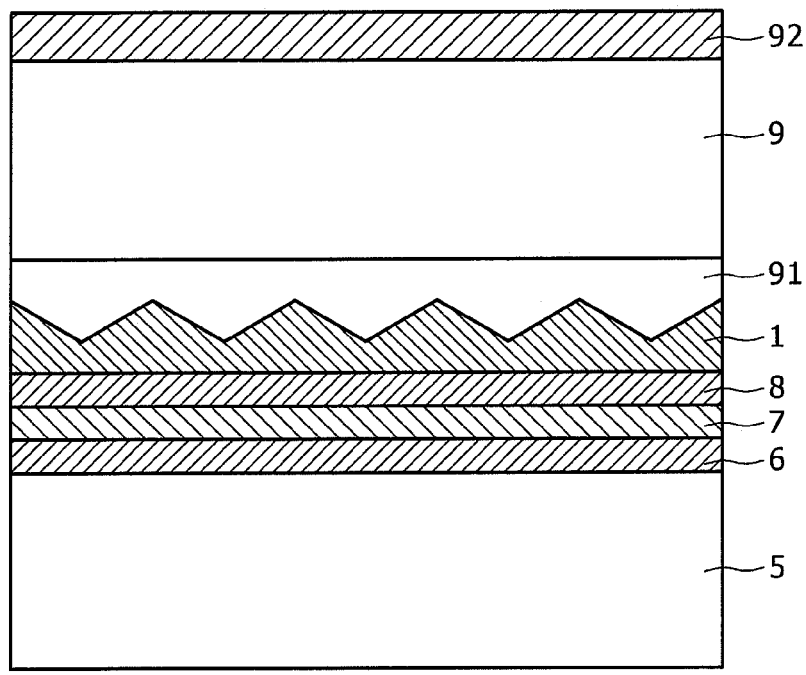
FIG. 10 is a cross sectional view illustrating a configuration of the organic light emission device according to the embodiment of the invention.

FIG. 10 is a cross sectional view illustrating a configuration of an organic light emission device according to the embodiment of the invention. FIG. 10 illustrates a so-called top emission type organic light emission device.

A light scattering layer 92 is disposed to the upper substrate 9 on the side opposite to the side where the organic layer 7 is present. A transparent resin layer 91 is interposed between the upper substrate 9 and the upper electrode 8. An adhesive sheet 1 is interposed between a transparent resin layer 91 and the upper electrode 8. The transparent resin layer 91 and the upper electrode 8 are bonded by the adhesive sheet.

As illustrated in FIG. 10, the transparent resin layer 91 is disposed to the lower surface of the upper substrate 9 and the light scattering layer 92 is disposed to the upper surface of the upper substrate 9, by which the effect of total reflection at the interface between the adhesive sheet 1 and the upper substrate 9 and at the interface between the upper substrate 9 and air (external portion) can be decreased and light emitted from the organic layer 7 can be taken out more effectively to the outside.

The refractive index of the adhesive sheet 1 is made larger than the refractive index of the transparent resin 91. Thus, light emitted from the organic layer can be taken out more to the side where the upper substrate 9 is present.

Concavo/convex portions are present to the transparent resin 91 on the side where the organic layer 7 is present. The concavo/convex shape of the transparent resin layer 91 includes, for example, a pyramidal shape. Specifically, conical shape, square pyramidal form or hexagonal pyramidal shape may be considered. The transparent resin layer 91 includes a base member and fine particles. The refractive index of the transparent resin layer 91 can be controlled by using an acrylic resin as the base member and dispersing fine particles of titanium oxide therein. The refractive index of the transparent resin layer 91 can be set optionally from 1.5 to 2.2. The base material for the transparent resin 91 includes, for example, PET (polyethylene terephthalate), silicone material, acrylic material, polyimide, epoxy material, etc. When the transparent resin layer 91 has a pyramidal shape, the apex of the pyramidal portion is preferably 70° or more and 5° or less. The refractive index of the transparent resin layer 91 is preferably 1.5 or more and 1.6 or less.

In the light scattering layer 92, an acrylic resin is used as a base material in which fine particles of zirconium oxide is dispersed. The base material of the light scattering layer 92 is preferably transparent and adhesive. Further, the refractive index of the base material of the light scattering layer 92 is preferably closer the refractive index of glass to and, more preferably, equal therewith. "Equal refractive index" means the degree of equality of refractive index capable of attaining the effect of the embodiment and strictive equality is not required. Specifically, it may suffice that the difference of the refractive index between both of them is within 0.1 and, preferably, within 0.05. As the base material for the light scattering layer 92, epoxy resin, PET, etc. can be used in addition to the acrylic resin. As the material of the fine particles dispersed in the light scattering layer 92, barium titanate and aluminum oxide, etc. can be used in addition to zirconium oxide. The fine particle may include the materials described above each alone or two or more them together.

The condition of total reflection for a portion of light put under total reflection at the interface between the adhesive sheet 1 and the upper substrate 9 due to the difference of the refractive index when the surface is flat with no concavo/convex portion is partially lost by making the surface of transparent resin layer uneven on the side where upper electrode 8 is present, and light can be taken out to the upper substrate 9. When the concavo/convex shape is present on the surface of the transparent resin layer 91, the refractive index of the adhesive sheet is preferably 1.7 or more and 1.9 or less.

Further, by providing the light scattering layer 92 to the upper surface of the upper substrate 9, the condition for total reflection of light put under total reflection at the interface between the upper substrate 9 and air is lost and light can be taken out into air.

Example 11

Figure 11:
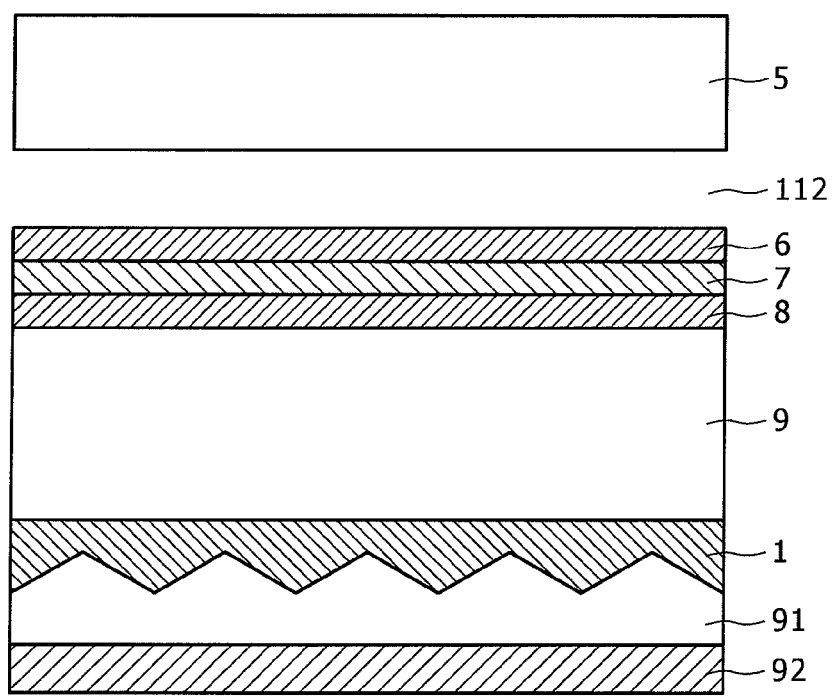
FIG. 11 is a cross sectional view illustrating a configuration of the organic light emission device according to the embodiment of the invention.

FIG. 11 is a cross sectional view illustrating a configuration of an organic light emission device according to the embodiment of the invention. FIG. 11 is a so-called bottom emission type organic light emission device.

As illustrated in FIG. 11, the organic light emission device according to the embodiment of the invention comprises a lower substrate 5, a lower electrode 6, an organic layer 7, an upper electrode 8, an upper substrate 9, an adhesive sheet 1, a transparent resin layer 91, and a light scattering layer 92. An illumination apparatus is obtained by providing the organic light emission device with a driving device or the like for driving the organic light emission device.

A gap 112 is present between the lower substrate 5 and the lower electrode 6. By the provision of the gap 112, contact between the lower substrate 5 and the lower electrode 6 over the upper substrate 9 can be avoided upon bonding the lower substrate 5 and the upper substrate 9 to each other, which can avoid change of the film thickness due to pressure upon contact and occurrence of disconnection or short-circuit in the worst case.

When the lower substrate 5 is a seal case manufactured from glass having indents, a moisture absorbent, etc. may be attached to the indents of the lower substrate 5. The lower electrode 6 and the upper electrode 8 are interposed between the lower substrate 5 and the upper substrate 9. The lower substrate 5, the lower electrode 6, the upper electrode 8, and the upper substrate 9 are disposed in the direction of taking out light. The organic layer 7 is interposed between the lower electrode 6 and the upper electrode 8. The light scattering layer 92 is disposed to the upper substrate 9 on the side opposite to the side where the organic layer 7 is present. The transparent resin layer 91 is interposed between the light scattering layer 92 and the upper substrate 9. The adhesive sheet 1 is interposed between the upper substrate 9 and the transparent resin layer 91. The organic layer 7 emits light when a voltage is applied between the upper electrode 8 and the lower electrode 6 to flow an electric current. Light generated from the organic layer 7 exits externally through the upper electrode 8, the upper substrate 9, and the adhesive sheet 1. That is, light generated from the organic layer 7 is taken out to the side of the organic layer 7 where the upper substrate 9 is present. In the bottom emission type, since the adhesive sheet 1 is not indirect contact with the organic light emission device, there is less restriction for low oxygen and low moisture in view of formation of the adhesive sheet 1, and the range of choice for solvents, etc. is also extended. The lower electrode 6 and the organic layer 7, the organic layer 7 and the upper electrode 8, and the upper electrode 8 and the upper substrate 9 may be in contact to each other, or other layer may be interposed between each of the layers.

Concavo/convex shape is present on the surface of the transparent resin layer 91 on the side where the upper substrate 9 is present. The transparent resin layer 91 and the upper substrate 9 are bonded to each other by the adhesive sheet 1. The refractive index of the adhesive sheet 1 is higher than the refractive index of the transparent resin layer 91. The refractive index of the adhesive sheet 1 is preferably identical with the refractive index of the upper substrate 9. "Equal refractive index" means the degree of equality of refractive index capable of attaining the effect of the embodiment and strictive equality is not required. Specifically, the difference of refractive index between both of them may be within 0.1 and, preferably, within 0.05.

The organic layer 7 emits light when a voltage is applied between the upper electrode 8 and the lower electrode 6 to flow an electric current. The light generated from the organic layer 7 exits through the adhesive sheet 1 to the outside. That is, light generated from the organic layer 7 is taken out on the side where the upper substrate 9 is present to the organic layer 7. When the lower electrode 6 is transparent, light exits to the outside also from the side of the lower substrate 5.

The adhesive sheet 1 is formed between the transparent resin layer 91 and the light scattering layer 92. When the transparent resin layer 91 is not formed, the upper substrate 9 and the light scattering layer 92 are bonded by the adhesive sheet 1.

In view of the light take out efficiency from the upper electrode 8 to the upper substrate 9, the refractive index of the upper substrate 9 is preferably 1.6 or more and 2.2 or less.

The present invention can provide an adhesive sheet having a high refractive index and high adhesion, an optical member, an organic light emission device, and an illumination device using the adhesive sheet, as well as a method of manufacture them.

LIST OF REFERENCE SIGNS

1 . . . adhesive sheet, 2 . . . adhesive particle, 3 . . . binder, 4 . . . base member, 5 . . . lower substrate, 6 . . . lower electrode, 7 . . . organic layer, 8 . . . upper electrode, 9 . . . upper substrate, 21 . . . inorganic particle, 22 . . . polymer, 41 . . . electrode, 91 . . . transparent resin layer, 92 . . . light scattering layer, 100 . . . optical member, 110 . . . substrate, 111 . . . electrode, 112 . . . gap

The invention claimed is:

1. An adhesive sheet including a binder and adhesive particles mixed in the binder in which the adhesive particle includes an inorganic particle and a polymer, the inorganic particle is chemically bonded with the polymer, the adhesive particles are partially exposed to the surface of the binder, the refractive index of the inorganic particle is higher than the refractive index of the binder, and the adhesion of the adhesive particle is larger than the adhesion of the inorganic particle, wherein
the polymer has substituents Y, the inorganic particle and the polymer are chemically bonded by way of a bonding site X, the bonding site X comprises one or more bonds selected from the group consisting of an amide bond, an ester bond, an ether bond, and a urethane bond, and the substituent Y is one or more members selected from the group consisting of amino group, a sulfo group, a carboxyl group, and a hydroxyl group.

2. An adhesive sheet according to claim 1, wherein the number average molecular weight of the polymer is from 200 to 50,000.

3. An adhesive sheet according to claim 1, wherein the inorganic particle is one or more members selected from the group consisting of titanium oxide, zirconium oxide, barium titanate and tin oxide.

4. An adhesive sheet according to claim 1, wherein the average particle diameter of the inorganic particles is 5 to 100 nm.

5. An adhesive sheet according to claim 1, wherein the ratio of the adhesive particles is 5 to 50 vol %.

6. An adhesive sheet according to claim 1, wherein the binder is an acrylic or silicone type resin.

7. An adhesive sheet according to claim 1, wherein a dispersing solvent is further contained.

8. An adhesive sheet according to claim 1, wherein the polymer is a phenol resin or polyamic acid.

9. An adhesive sheet according to claim 1, wherein the polymer is one or more members selected from the group consisting of polyacrylic acid, polyvinyl alcohol, polyaspartic acid, polyglutamic acid, alginic acid, polyvinyl sulfonic acid, polystyrene sulfonic acid, and amylose.

10. An optical member including a base member and an adhesive sheet according to claim 1, in which the adhesive sheet is bonded to the surface of the base member, and the base member comprises one or more members selected from the group consisting of resins, glass, ceramics and metals.

11. An organic light emission device including a lower substrate, an upper substrate, a lower electrode, an upper electrode, an organic layer, and an adhesive sheet according to claim 1, in which the lower electrode and the upper electrode are interposed between the lower substrate and the upper substrate, the organic layer is interposed between the lower electrode and the upper electrode, the adhesive sheet is interposed between the upper substrate and the upper electrode, the organic layer emits light by a voltage application between the upper electrode and the lower electrode, and light generated from the organic layer exits externally at least by way of the upper substrate.

12. An organic light emission device according to claim 11, which further includes a light scattering layer and a transparent resin layer, in which the upper substrate is interposed between the light scattering layer and the transparent resin layer, the transparent resin layer is interposed between the upper substrate and the upper electrode, the adhesive sheet is interposed between the transparent resin layer and the upper electrode, the transparent resin layer has a concavo/convex shape, and the refractive index of the adhesive sheet is higher than the refractive index of the transparent resin layer.

13. An organic light emission device according to claim 11, which further includes a light scattering layer and a transparent resin layer in which the upper substrate is interposed between the upper electrode and the transparent resin layer, the transparent resin layer is interposed between the light scattering layer and the upper substrate, the adhesive sheet is interposed between the upper substrate and the transparent resin layer, the transparent resin layer has a concavo/convex shape, a gap is disposed between the lower substrate and the lower electrode, and the refractive index of the adhesive sheet is higher than the refractive index of the transparent resin layer.

14. A method of manufacturing an adhesive sheet including an inorganic particle dispersion step of preparing a liquid dispersion by adding inorganic particles to a dispersing solvent, a reaction step of adding a silane coupling agent to the liquid dispersion thereby bonding the silane coupling agent and the inorganic particle, an adhesive particle preparation step of adding a polymer to a liquid obtained by the reaction step and chemically bonding the inorganic particle and the polymer thereby manufacturing adhesive particles, and a step of mixing the adhesive particles and the binder, in which the refractive index of the inorganic particle is higher than the refractive index of the silane coupling agent, and the adhesion of the adhesive particle is larger than the adhesion of the inorganic particle, wherein the polymer has substituents Y, the inorganic particle and the polymer are chemically bonded by way of a bonding site X, the bonding site X comprises one or more bonds selected from the group consisting of an amide bond, an ester bond, an ether bond, and a urethane bond, and the substituent Y is one or more members selected from the group consisting of amino group, a sulfo group, a carboxyl group, and a hydroxyl group.

15. An adhesive sheet including a binder and adhesive particles mixed in the binder in which the adhesive particle includes an inorganic particle and a polymer, the inorganic particle is chemically bonded with the polymer, the adhesive particles are partially exposed to the surface of the binder, the refractive index of the inorganic particle is higher than the refractive index of the binder, and the adhesion of the adhesive particle is larger than the adhesion of the inorganic particle, wherein the polymer is a phenol resin or polyamic acid.

16. An organic light emission device including a lower substrate, an upper substrate, a lower electrode, an upper electrode, an organic layer, and an adhesive sheet including a binder and adhesive particles mixed in the binder in which the adhesive particle includes an inorganic particle and a polymer, the inorganic particle is chemically bonded with the polymer, the adhesive particles are partially exposed to the surface of the binder, the refractive index of the inorganic particle is higher than the refractive index of the binder, and the adhesion of the adhesive particle is larger than the adhesion of the inorganic particle, in which the lower electrode and the upper electrode are interposed between the lower substrate and the upper substrate, the organic layer is interposed between the lower electrode and the upper electrode, the adhesive sheet is interposed between the upper substrate and the upper electrode, the organic layer emits light by a voltage application between the upper electrode and the lower electrode, and light generated from the organic layer exits externally at least by way of the upper substrate, and further including a light scattering layer and a transparent resin layer, in which the upper substrate is interposed between the light scattering layer and the transparent resin layer, the transparent resin layer is interposed between the upper substrate and the upper electrode, the adhesive sheet is interposed between the transparent resin layer and the upper electrode, the transparent resin layer has a concavo/convex shape, and the refractive index of the adhesive sheet is higher than the refractive index of the transparent resin layer.

* * * * *